United States Patent
Riley, Jr. et al.

(10) Patent No.: US 6,194,352 B1
(45) Date of Patent: *Feb. 27, 2001

(54) MULTIFILAMENT COMPOSITE BSCCO OXIDE SUPERCONDUCTOR

(75) Inventors: Gilbert N. Riley, Jr., Marlborough; Jeffrey M. Seuntjens, Spencer; William L. Barnes, Brockton; Gregory L. Snitchler, Shrewsbury; Alexander Otto, Chelmsford, all of MA (US)

(73) Assignee: American Superconductor Corporation, Westborough, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/553,184

(22) Filed: Nov. 7, 1995

Related U.S. Application Data

(63) Continuation-in-part of application No. 08/188,220, filed on Jan. 28, 1994, now Pat. No. 5,531,015.

(51) Int. Cl.$^7$ ............................ H01B 12/02; H01L 39/12
(52) U.S. Cl. ........................ 505/431; 505/492; 505/501; 505/740; 174/125.1
(58) Field of Search ................................. 505/500, 501, 505/430, 431, 432, 433, 491, 492, 231, 813, 918, 921, 740, 886; 252/521; 264/345, 175, 211.12, 61; 174/125.1

(56) References Cited

U.S. PATENT DOCUMENTS

| | | |
|---|---|---|
| 4,885,273 | 12/1989 | Sugimoto et al. . |
| 4,965,245 | 10/1990 | Sugimoto et al. .............. 174/125.01 |

(List continued on next page.)

FOREIGN PATENT DOCUMENTS

| | | |
|---|---|---|
| 0 390 499 A2 | 10/1990 | (EP) . |
| 0 496 281 | 7/1992 | (EP) . |

(List continued on next page.)

OTHER PUBLICATIONS

Christopherson, C.J., et al., "Development of twisted high–temperature superconductor composite conductors", Appl. Phys. Lett., 66(17), 2277–2279, Apr. 1995.*

(List continued on next page.)

Primary Examiner—Mark Kopec
(74) Attorney, Agent, or Firm—Clark & Elbing LLP; Mary Rose Scozzafava

(57) ABSTRACT

A method for preparing an oxide superconductor cable includes transposing a plurality of oxide superconductor strands along a longitudinal axis so as to form a cable and exposing the cable to a two step heat treatment after cabling of the oxide strands, the heat treatment comprising, (a) heating the cable to and maintaining the cable at a first temperature sufficient to partially melt the article, such that a liquid phase co-exists with the desired oxide superconductor phase; and (b) cooling the cable to and maintaining the cable at a second temperature sufficient to substantially transform the liquid phase into the desired oxide superconductor. The oxide superconductor multistrand cable includes a plurality of oxide superconductor strands, each of the strands including an oxide superconductor having an irreversible melt characteristic, wherein the plurality of oxide strands are transposed about a longitudinal axis, such that each of the strands are substantially electrically and substantially mechanically isolated; and wherein the cable exhibits critical transport properties ($J_c$) of at least about 10,000 A/cm$^2$ at 77K, self field.

11 Claims, 7 Drawing Sheets

U.S. PATENT DOCUMENTS

| | | | |
|---|---|---|---|
| 4,973,574 | * 11/1990 | Nishio et al. | 505/740 X |
| 4,975,416 | * 12/1990 | Onishi et al. | 505/740 X |
| 4,992,415 | 2/1991 | Ashok et al. | 505/740 X |
| 4,994,633 | * 2/1991 | Puhn | 505/886 X |
| 4,999,338 | * 3/1991 | Wijeyesekera et al. | 505/785 X |
| 5,045,527 | 9/1991 | Ikeno et al. | 505/740 X |
| 5,047,391 | 9/1991 | Bock et al. | 505/739 X |
| 5,057,489 | 10/1991 | Okhawa et al. | 505/884 X |
| 5,063,200 | 11/1991 | Okada et al. | 1/505 |
| 5,063,201 | 11/1991 | Rao et al. | 505/739 X |
| 5,068,219 | 11/1991 | Hagino et al. | 599/59 |
| 5,073,679 | * 12/1991 | Bencharab et al. | 505/886 X |
| 5,081,075 | 1/1992 | Jin et al. | 599/29 |
| 5,106,825 | 4/1992 | Mandigo et al. | 1/505 |
| 5,110,789 | 5/1992 | Yamaguchi et al. | 599/29 |
| 5,126,094 | 6/1992 | Farzin-Nia et al. | 264/346 |
| 5,140,006 | 8/1992 | Woolf | 1/505 |
| 5,145,829 | 9/1992 | Asano et al. | 505/740 X |
| 5,149,684 | 9/1992 | Woolf et al. | 505/742 X |
| 5,187,859 | 2/1993 | Heim | 599/29 |
| 5,192,739 | * 3/1993 | Lay | 505/740 X |
| 5,204,315 | 4/1993 | Ito et al. | 505/740 X |
| 5,208,215 | 5/1993 | Chen et al. | 505/740 X |
| 5,231,366 | 7/1993 | Haramaki et al. | 599/29 |
| 5,246,917 | 9/1993 | Hikata et al. | 505/740 X |
| 5,312,802 | 5/1994 | Hayashi et al. | 174/125.1 |
| 5,324,712 | 6/1994 | Su . | |
| 5,330,969 | 7/1994 | Finnemore et al. | 431/505 |
| 5,369,089 | * 11/1994 | Sato et al. | 505/433 |
| 5,531,015 | * 7/1996 | Manlief et al. | 29/599 |
| 5,635,456 | * 6/1997 | Riley et al. | 505/501 |
| 5,661,114 | * 8/1997 | Otto et al. | 505/501 |

FOREIGN PATENT DOCUMENTS

| | | |
|---|---|---|
| 0 449 411 A1 | 8/1992 | (EP) . |
| 676817 | * 10/1995 | (EP) . |
| 1-012413 | 1/1989 | (JP) . |
| 1-241708 | 9/1989 | (JP) . |
| 1-241713 | 9/1989 | (JP) . |
| 1275434 | 11/1989 | (JP) . |
| 230617 | 2/1990 | (JP) . |
| 4317415 | * 11/1992 | (JP) . |
| 6187849 | 7/1994 | (JP) . |
| 6325629 | 11/1994 | (JP) . |
| 6325634 | 11/1994 | (JP) . |
| 7014443 | 1/1995 | (JP) . |
| 7045136 | 2/1995 | (JP) . |
| 7065646 | 3/1995 | (JP) . |
| 230404 | 5/1991 | (NZ) . |
| WO 93/22799 | 11/1993 | (WO) . |
| 94/23459 | * 10/1994 | (WO) . |

OTHER PUBLICATIONS

Sytnikov, V.E., et al., "An experimental study of the transport properties of a flexible high–Tc superconducting cable", Supercond. Sci. Technol., 7(3), 115–117, Mar. 1994.*

Luo, J.S., et al., "Phase Chemistry and Microstructure Evolution in Silver–Clad Wires", IEEE Transactions on Applied Superconductivity, 3(1), 972–975. (Conference held Aug. 23–28, 1992), Mar. 1993.*

Ueda, K., et al., "Design and Testing of a Pair of Current Leads using Bismuth Compound Superconductor", IEEE Transactions on Applied Superconductivity, 3(1), 400–403. (Conference held Aug. 23–28, 1992.), Mar. 1993.*

Guo, Y.C., et al., "Stability of high–Tc phase in Ag–clad Bi–based superconducting wires", Physica C, 200(3&4), 147–154, Oct. 1992.*

Sato, K., et al., "Transport current properties of silver–sheathed BiPbSrCaCuO wire and coil", Cryogenics, 31, 687–689, Jul. 1991.*

C.J. Christopheron and G.N. Riley, Jr. "Development of Twisted High–Temperature Superconductor Composite Conductors" Appl. Phys. Lett. 66(17):2277 (Apr. 1995).

"Microstructure and Critical Current Density of Zone Melt Textured $YBa_2Cu_3O_{6+x}/Y_2BaCuO_5$ with $BaSn_3$ Additions" McGinn et al., Appl. Phys. Lett. 59(1), 120–122 (Jul. 1, 1991).

"Incongruent Melting of the High Temperature Superconductor $YBa_2Cu_3O_7$" McCallum et al., XVII Int. Conf. on Low Temp. Physics, 1–2 (Aug. 20–26, 1987).

"Investigation of Heat–Treating Conditions for Silver–Sheathed Bi2212 Superconducting Coils" Shibutani et al., Jpn. J. Appl. Phys. 30(12A), 3371–3376 (Dec. 1991).

"Critical Current Enhancement in Silver–Clad $Bi_2Sr_2CaCu_2O_x$ Wires Using a Statistical Experimental Design for Heat Treatment Optimization" Bowker, J. and Whitlow, G., Jpn. J. Appl. Phys. 32(1), 51–54 (Jan. 1993).

"Effects of Heating Temperature and Atmosphere on Critical Current Density of $Bi_2Sr_2Ca_1Cu_2Ag_{0.8}O_y$, Ag–sheathed Tapes" Endo, A. and Nishikida, S. IEEE Trans. Appl. Supercond. 3(1), 931–934 (Mar. 1993).

"Post Sintering Oxygen Pressure Effects on the $J_c$ of BPSCCO–Silver Clad Tapes" K.W. Lay, Mat. Res. Soc. Symp. Proc., 275, 651–661 (Oct. 26, 1992).

"Fabrication and Critical Current Density of Ag–Sheathed Bi(Pb)(SrCaCuO Superconducting Wires" S.X. Dou, Publication date not known, if any.

"Growth of the 2223 Phase in Leaded Si–Sr–Ca–Cu Oxide Reduced Oxygen Partial Pressure" Aota et al., Jap. J. of Appl. Phys. 28(12), L2196–9 (Dec. 1989).

"Critical Issues in the OPIT Processing of High–$J_c$BSCCO Superconductors" Sandhage et al., J. Mat. Met. Metal., 21–25 (Mar. 1991).

"Effect of a Controlled Melt Process on Phase Transformation and Electromagnetic Properties of BiPbSrCaCuO/Ag Superconducting Wires" Guo et al., Applied Superconductivity 1(1/2), 25–31 (Jan. 1993).

"Growth of the 2223 Phase in Leaded Bi–Sr–Ca–Cu–O System" Hatano et al., Jap. J. of Appl. Phys. 27(11), L2055–L2058 (Nov. 1988).

"Development of High–$T_c$ Superconductor Wires for Magnet Applications" Tenbrink et al., IEEE TRans. Mag. 27(2), 1239–1246 (Mar. 1991).

Phase Diagrams for High $T_c$ Superconductors Ed. John D. Whitler and Robert S. Roth, The American Ceramic Society, Westerville, Ohio (1991) (Cover sheet only).

"Growth Mechanism of High $T_c$ Phase in Leaded Bi–Sr–Ca–Cu–O System" Hatano et al., (1990) (Preprint).

"Thermostability and Decomposition of the $(Bi, Pb)_2Sr_2Ca_2Cu_3O_{10}$ Phase in Silver–Clad Tapes" Luo et al., J. of Appl. Phys. 72(6), 2385–2389 (Sep. 1992).

"Kinetics and Mechanism of the $(Bi,Pb)_2Sr_2Ca_2Cu_3O_{10}$ Formation Reaction in Silver–Sheathed Wires" Luo et al., Appl. Sup. 1(1/2), 101–107 (Jan. 1993).

"The Effect of Sintering Conditions on the Formation of the High–$T_c$ Phase in the Bi–Sr–Ca–Cu–O Sytem" Kobayashi et al., Jap. J. Appl. Phys. 28, L772–L774 (1989).

"Preparation of the Textured Bi–Based Oxide Tapes by Partial Melting Process" Kase et al., IEEE Trans. Mag. 27(2), 1254–1257 (Mar. 1991).

"Fabrication of Ag–Sheathed Bi–Superconducting Tapes and Coils" *IEEE Trans. Appl. Supercond.* 5(2) 1267 (1995).

"Effect of a Controlled Melt Process on Phase Transformation and Electromagnetic Properties of BiPbSrCaCuO/Ag Superconducting Wires" *Applied Superconductivity*, 1(12):25–31 (1993).

Ekin et al., "Effect of acial strain on the critical current of Ag–sheathed Bi–based superconductors in magnetic fields up to 25 T," *Applied Physics Letters 61*, 858–860, 1992.

Lou et al., "Thermostability and decomposition of the $(Bi, Pb)_2Sr_2Ca_2Cu_3O_{10}$ phase in silver–clad tapes," *J. Appl. Phys.* 72, 2385–2389, 1992.

Riley et al., "Ceramic Superconductor Composite Wires," *American Ceramic Society Bulletin* 72, 91–97, 1993.

Sato et al., "High–Jc Silver–Sheathed Bi–Based Superconducting Wires," *IEEE Transactions on Magnetics 27*, 1231–1238, 1991.

Tenbrink et al., "Recent Results on Test Winding and Coils Using B1–2212/Ag HTSC Wires," *paper CY–2, ICMC'93*, 1993.

* cited by examiner

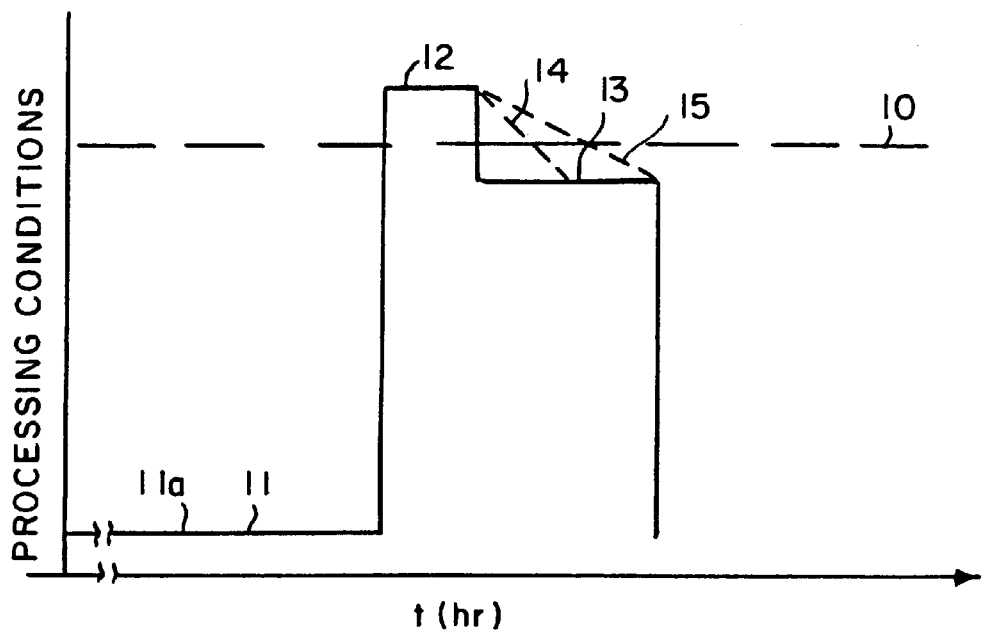
F I G. 1
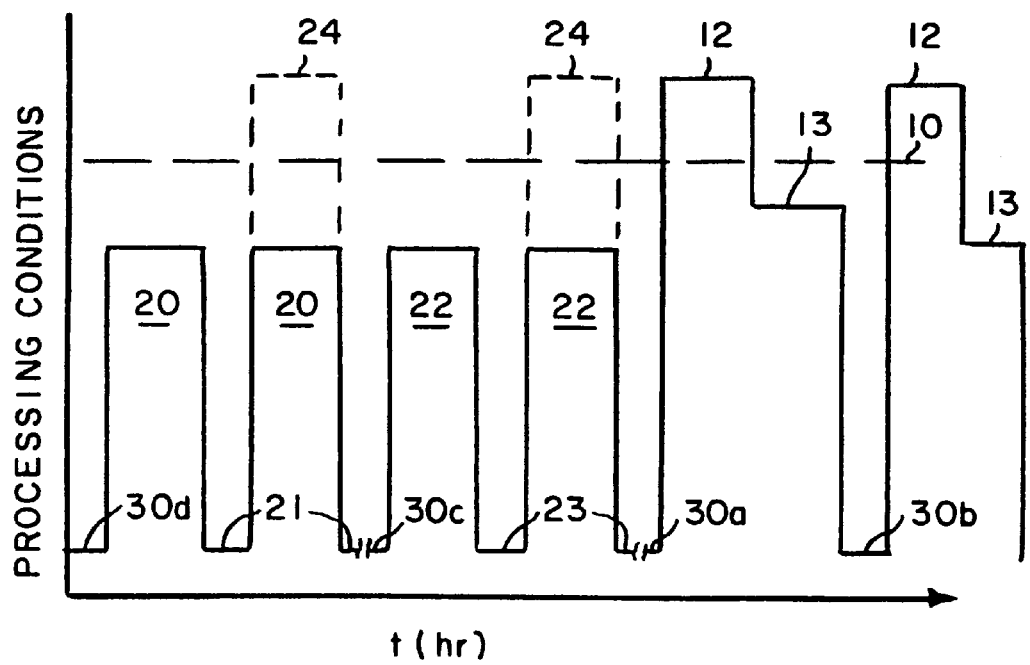
F I G. 2

MULTIFILAMENT COMPOSITE BSCCO OXIDE SUPERCONDUCTOR

This application is a continuation-in part application of application U.S. Ser. No. 08/188,220, entitled "Method of Making Superconducting Wind-And-React Coils", filed on Jan. 28, 1994 and now issued as U.S. Pat. No. 5,531,015.

FIELD OF THE INVENTION

This invention relates to cabled superconducting oxide conductors and to a method for their manufacturing. The present invention further relates to a method for healing defects introduced into the oxide superconductor composite during cabling and thereby improving superconducting properties.

BACKGROUND OF THE INVENTION

Since the discovery of oxide superconducting materials with transition temperatures above about 20 Kelvin the possibility of using them to obtain greater efficiency in electrical and magnetic applications has attracted considerable interest. However, to be practical outside the laboratory, most electrical and magnetic applications require flexible cabled lengths of conductor manufacturable with high packing factors which can be manufactured at reasonable cost and with high engineering current-carrying capacity. High packing factor forms are needed because limited space constraints and high overall current requirements are major design issues. Conductors which are flexibly cabled, that is, composed of twisted, helically wound, braided or otherwise transposed bundles of electrically, and sometimes mechanically, isolated conductor strands, are desired in many applications, including coils, rotating machinery and long length cables. In comparison to monolithic conductors of comparable composition and cross-section, cabled forms which are made from a number of isolated conductors strands will have much higher flexibility. Substantially mechanically isolated cable strands have some ability to move within the cable, although some degree of mechanical locking of the strands is desired for stability and robustness of the conductor to stay together during handling and winding. Electrical isolation of the cable strands is preferred but not required. In low temperature superconducting conductors, cables which are made from a number of substantially electrically isolated and transposed conductor strands have been shown to have greatly reduced AC losses in comparison to monolithic conductors. See *"Superconducting Magnets"* by Martin Wilson (1983,1990), pp 197, 307–309. It has been proposed that the same relation will hold for high temperature superconductors. Flexibility increases in proportion to the ratio between the cable cross-section and the strand cross-section. AC losses are believed to decrease in relation to cable cross-section, strand cross-section and twist pitch. Thus, the greater the number of strands in a cable of given dimension, the more pronounced these advantages will be.

However, it has not been considered feasible to form oxide superconductors in high winding density, tightly transposed configurations because of the physical limitations of the material. Superconducting oxides have complex, brittle, ceramic-like structures which cannot by themselves be drawn into wires or similar forms using conventional metal-processing methods and which do not possess the necessary mechanical properties to withstand cabling in continuous long lengths. Consequently, the more useful forms of high temperature superconducting conductors usually are composite structures in which the superconducting oxides are supported by a matrix material, typically a noble metal, which adds mechanical robustness to the composite.

Even in composite forms, the geometries in which high-performance superconducting oxide articles may be successfully fabricated are constrained by the relative brittleness of the composite, by the electrical anisotropy characteristic of the oxide superconductor, and by the necessity of "texturing" the oxide material to achieve adequate critical current density. Unlike other known conductors, the current-carrying capacity of a superconducting oxide composite depends significantly on the degree of crystallographic alignment and intergrain bonding of the oxide grains, together known as "texturing", induced during the composite manufacturing operation.

Known processing methods for obtaining textured oxide superconductor composite articles include an iterative process of alternating anneal and deformation steps. The anneal is used to promote reaction-induced texture (RIT) of the oxide superconductor in which the anisotropic growth of the superconducting grains is enhanced. Each deformation provides an incremental improvement in the orientation of the oxide grains (deformation-induced texturing or DIT).

The texture derived from a particular deformation technique will depend on how closely the applied strain vectors correspond to the slip planes in the superconducting oxide. Thus, superconducting oxides such as the BSCCO family, which have a micaceous structure characterized by highly anisotropic preferred cleavage planes and slip systems, possess a highly anisotropic current-carrying capacity. Such superconducting oxides are known to be most effectively DIT textured by non-axisymmetric techniques such as pressing and rolling, which create highly aspected (greater than about 5:1) forms. Other methods of texturing BSCCO 2223 have been described in U.S. Ser. No. 08/302,601, filed Sep. 8, 1994 entitled "Torsional Texturing of Superconducting Oxide Composite Articles", which describes a torsional texturing technique; U.S. Ser. No. 08/041,822 filed Apr. 1, 1993, entitled "Improved Processing for Oxide Superconductors" now issued as U.S. Pat. No. 5,635,456; and U.S. Ser. No. 08/198,912 filed Feb. 17, 1994, entitled "Improved Processing of Oxide Superconductors" which is now issued as U.S. Pat. No. 5,635,456 which describes an RIT technique based on partial melting. These techniques have been observed to provide the greatest improvement in the Jc's of BSCCO 2223 samples when used in combination with a highly non-axisymmetric DIT technique, such as rolling.

Although superconducting oxide composite articles may be textured by various methods, including magnetic alignment, longitudinal deformation (DIT) or heat treatment (RIT), not all texturing methods are equally applicable to, or effective for, all superconducting oxides. For example, known techniques for texturing the two-layer and three-layer phases of the bismuth-strontium-calcium-copper-oxide family of superconductors ($Bi_2Sr_2Ca_1Cu_2O_x$ and $Bi_2Sr_2Ca_2Cu_3O_x$, also known as BSCCO 2212 and BSCCO 2223, respectively) are described in Tenbrink et al., "Development of Technical High-$T_c$ Superconductor Wires and Tapes", Paper MF-1, Applied Superconductivity Conference, Chicago(Aug. 23–28, 1992), H. B. Liu and J. B. Vander Sande, submitted to Physica C, (1995), and Motowidlo et al., "Mechanical and Electrical Properties of BSCCO Multifilament Tape Conductors", paper presented at Materials research Society Meeting, Apr. 12–15, 1993. Micaceous oxides such as the BSCCO family which demonstrate high current carrying capacity in the absence of biaxial texture have been considered especially promising for electrical applications because they can be textured by techniques which are readily scalable to long-length manufacturing.

Liquid phases in co-existence with solid oxide phases have been used in processing of oxide superconductors. One type of partial melting, known as peritectic decomposition, takes advantage of liquid phases which form at peritectic points of the phase diagram containing the oxide superconductor. During peritectic decomposition, the oxide superconductor remains a solid until the peritectic temperature is reached, at which point the oxide superconductor decomposes into a liquid phase and a new solid phase. The peritectic decompositions of $Bi_2Sr_2CaCu_2O_{8+x}$, (BSCCO 2212, where $0 \leq x \leq 1.5$), into an alkaline earth oxide and a liquid phase and of $YBa_2Cu_3O_{7-\delta}$ (YBCO 123, where $0 \leq \delta \leq 1.0$) into $Y_2BaCuO_5$ and a liquid phase are well known. Kase et al. in IEEE Trans. Mag. 27(2), 1254 (1991) report obtaining highly textured BSCCO 2212 by slowly cooling through the peritectic point, a RIT technique because BSCCO 2212 totally melts and reforms during melt textured growth, any texturing induced by deformation prior to the melting will not influence the final structure.

However, BSCCO 2223 cannot be effectively textured by the melt-textured growth technique. Instead of peritectic melting, BSCCO 2223 exhibits irreversible melting in that solid 2223 does not form directly from a liquid of 2223 composition. RIT techniques applicable to BSCCO 2223 rely on some type of partial melting, such as eutectic melting, solid solution melting or formation of non-equilibrium liquids, in which the oxide superconductor coexists with a liquid phase rather than being totally decomposed.

Partial melting of $(Bi,Pb)_2Sr_2Ca_2Cu_3O_{10+x}$, ((Bi,Pb)SCCO 2223, where $0 \leq x \leq 1.5$) and $(Bi)_2Sr_2Ca_1Cu_2O_{10+x}$ ((Bi)SCCO 2223, where $0 \leq x \leq 1.5$) at temperatures above 870° C. in air has been reported; see, for example, Kobayashi et al. Jap. J. Appl. Phys. 28, L722–L744 (1989), Hatano et al. Ibid. 27(11), L2055 (Nov. 1988), Luo et al. Appl. Super. 1, 101–107, (1993), Aota et al. Jap. J. Appl. Phys. 28, L2196–L2199 (1989) and Luo et al. J Appl. Phys. 72, 2385–2389 (1992). The exact mechanism of partial melting of BSCCO-2223 has not been definitively established.

Such partial melting techniques are inherently more dependent on the geometry of the initial phase than melt-textured growth, and texturing induced by deformation prior to the partial melting will have a significant impact on the texturing of the final product. In short, for superconducting oxides with irreversible melting characteristics, such as BSCCO 2223, superior texturing and current-carrying capacity are most obtainable in highly aspected forms such as tapes.

Unfortunately, highly aspected superconducting oxide tapes are particularly difficult to cable. All superconducting oxide composites are brittle by the standards of conventional conductors. It is well known that exerting any bend strain in excess of a critical strain which is determined by the composition and geometry of the composite (and which is typically on the order of 0.1–1%) will severely degrade its electrical and mechanical properties. Strands which are round in cross-section can be bent in any plane and the bend strain will be the same, but the strain on a highly aspected strand will depend on the bend direction, with highest strains when the bend is in the plane of the longer cross-sectional dimension. The effect on strand performance can be considerable, since the bend strain increases proportionally to the thickness of the bent material and the critical current drops asymptotically at bend strains in excess of the critical strain.

Since the lowest coupling losses are predicted to come from fully transposed cables, limitations on the direction in which the strands can be cabled also limits the potential usefulness of the cabled conductor. Unfortunately, some forms of transposition makes it inevitable that some portion of the cabled conductor will not be oriented in the preferred direction. Thus, an important consideration in fabricating high performance oxide superconducting conductors is maximizing the portions which do have the desired orientations. It is thus desirable to main a common orientation for all strands in the cable. In rigid cabling techniques the oxide superconducting strands rotate around cable axis resulting in strands of various orientations. In planetary cabling, the oxide superconductor strands do not rotate and transposition only results in slight misorientation.

The difficulties of handling superconducting oxide strands appear even more pronounced when the need for a low cost, scalable cable manufacturing process is considered. There are a number of well-known cabling techniques, such as Rutherford cabling, braiding, and other forms of Litz cabling, for transposing low aspect ratio strands of conventional conductor material on automated machinery, which rely on gradual radial bending of the conductor strands, but to make high packing factor cables on these machines requires bending strains in excess of those tolerated by conventional oxide superconductor strands. The problem is even worse for aspected forms. The best-known automatic technique for cabling conventional highly aspected conductors requires sharp bends in the strand at regular intervals and so, not surprisingly, has never been demonstrated to be practicable for oxide superconducting composites.

SUMMARY OF THE INVENTION

These and other objects of the invention are obtained by subjecting an oxide superconductor cable to one or more two step heat treatments, after cabling or deformation, or both, of the article. The two step heat treatment includes (a) heating the cabled article at a temperature sufficient to partially melt the cabled article, such that a liquid phase co-exists with the desired oxide superconductor phase; and (b) cooling the cabled article to a temperature sufficient to transform the liquid phase into the desired oxide superconductor, with no deformation or cabling occurring after the final heat treatment. The deformation or cabling operations are those which introduce strains of about at least 5–10% and which introduce defects perpendicular to the direction of current flow resulting in significant loss of superconducting performance as measured by critical current. Strain is defined with respect to the oxide superconductor cable itself, as opposed to strain of the individual oxide strands or oxide filaments.

In another aspect of the invention, an oxide superconductor cable is prepared by exposing an oxide superconductor cable to a two step heat treatment and thereafter texturing the oxide superconductor cable. The heat treatment comprises the steps of (a) heating the cable to and maintaining the cable at a first temperature sufficient to partially melt the cable, such that a liquid phase co-exists with the desired superconducting oxide phase; and (b) cooling the cable to and maintaining the cable at a second temperature sufficient to substantially transform the liquid phase into the desired oxide superconductor. The oxide superconductor cable is then textured. The texturing process may be selected such that no further deformations are introduced into the cable.

Suitable texturing processes include reaction induced texturing (RIT) and magnetic field induced grain alignment, discussed above. Alternatively, the texture operation may cause defects, i.e., deformation induced texturing (DIT), in which case, it may be desirable to perform a subsequent two step heat treatment, as described in steps (a) and (b), above.

In another aspect of the present invention, an oxide superconductor cable may be prepared by texturing an oxide superconductor cable and thereafter exposing the textured oxide superconductor cable to a two step heat treatment of the invention. The texturing process may be selected such that no further deformations are introduced into the cable. Alternatively, the texture operation may cause defects, i.e., deformation induced texturing (DIT).

In another aspect of the invention, an oxide superconductor cable containing a desired oxide superconductor phase is exposed to a one or more two step heat treatments after deformation or cabling, or both, of the oxide superconducting cable which includes (a) forming a liquid phase in the oxide superconducting cable such that the liquid phase co-exists with the desired oxide superconductor solid phase; and then (b) transforming the liquid phase into the desired oxide superconductor, with no deformation or cabling occurring after the final heat treatment. Cabling and deformation after final heat treatment referred to are those which introduce strains of about at least 5–10% and which introduce defects perpendicular to the direction of current flow resulting in significant loss of superconducting performance as measured by critical current. Strain is defined with respect to the oxide superconductor cable itself, as opposed to stain of the individual oxide strands or oxide filaments.

In preferred embodiments, the liquid phase wets surfaces of defects contained within the oxide superconductor cable strands. The defects are healed upon transformation of the liquid to the desired oxide superconductor. The partial melting of step (a) and the transformation of step (b) are effected by selection of appropriate thermodynamic state variables, for example, temperature, $P_{O2}$, $P_{total}$ and total composition. In principle, deformation or cabling may occur during the final heat treatment up to immediately prior to the completion of step (a), providing that the liquid phase is available for a period of time sufficient to wet defect surfaces.

By "cable", as that term is used herein, it is meant an assemblage of a number of individual strands in close proximity along their length in a periodic arrangement by techniques including transposing, interweaving, twisting, braiding, helically winding, and the like, of the strands. Each strand of the cable may be substantially electrically isolated, and the cable may be flexible.

By "strand", as that term is used herein, it is meant the individual lengths of oxide superconductor which are used to weave, to transpose or otherwise form the oxide superconductor cable. The strands may be rounded or may have a flattened, aspected cross-sectional geometry because of the deformation processes used to DIT texture. The strands themselves may be composed of one or multiple filaments of oxide superconductor supported within or on a malleable, conductive matrix, preferably a noble metal, or may themselves be cables.

By "two step heat treatment", as that term is used herein, is meant a heat treatment for healing defects and forming an oxide superconductor. By "final two-step heat treatment", as that term is used herein, it is meant a heat treatment for forming an oxide superconductor after which no further deformation or cabling occurs. However, heat treatments for purposes other than those stated herein, such as, for example, oxygenation of the oxide superconductor, are possible.

By "partial melt", as that term is used herein, it is meant the oxide superconductor article is only partially melted, and that the desired oxide superconductor is present during melting.

By "deformation" as that term is used herein, it is meant a process which causes a change in the cross-sectional shape of the article, without loss of mass.

By "oxide superconductor precursor", as that term is used herein, it is meant any material that can be converted to an oxide superconductor upon application of a suitable heat treatment. Suitable precursor materials include but are not limited to metal salts, simple metal oxides, complex mixed metal oxides and intermediate oxide superconductors to the desired oxide superconductor.

By "desired oxide superconductor", as that term is used herein, it is meant the oxide superconductor which it is desired to ultimately prepare. An oxide superconductor is typically the "desired" oxide superconductor because of superior electrical properties, such as high $T_c$ and/or $J_c$. The desired oxide superconductor is typically a high $T_c$ member of a particular oxide superconductor family, i.e., BSCCO 2223, YBCO 123, TBCCO 1212 and TBCCO 1223.

By "intermediate oxide superconductor", as that term is used herein, it is meant an oxide superconductor which is capable of being converted into a desired oxide superconductor. However, an intermediate oxide superconductor may have desirable processing properties, which warrants its formation initially before final conversion into the desired oxide superconductor. The formation of an "intermediate oxide superconductor" may be desired, particularly during anneal/deformation iterations, where the intermediate oxides are more amenable to texturing than the desired oxide superconductor.

In preferred embodiments, the intermediate oxide superconductor is BSCCO 2212 or (Bi,Pb)SCCO 2212 because it is readily textured by the deformation/anneal iterations. The intermediate oxide superconductor is then converted to a desired oxide superconducting phase, typically BSCCO 2223 or (Bi,Pb)SCCO 2223. The partial melting of step (a) may be carried out at a temperature in the range of 820–835° C. at 0.075 atm $O_2$. The transformation of the liquid in step (b) may be carried out at a temperature in the range of 790–820° C. at 0.075 atm $O_2$. In other preferred embodiments, the desired oxide superconductor, may be YBCO 123, $Y_2Ba_4Cu_7O_{14-\delta}$ (YBCO 247), $(Tl,Pb)_1Ba_2Ca_1Cu_2O_{6.0\pm y}$ (TBCCO 1212) or $(Tl,Pb)_1Ba_2Ca_2Cu_3O_{8.0\pm y}$ (TBCCO 1223), where $0 \leq \delta \leq 1.0$ and y ranges up to 0.5. The stated stoichiometries are all approximate and intentional or unintentional variations in composition are contemplated within the scope of the invention.

In other preferred embodiments, the liquid phase is formed in the range of 0.1–30 vol %. In yet other preferred embodiments, the anneal of the first and second anneal/deformation iterations partially melts the oxide superconductor cable.

In yet another aspect of the invention, an oxide superconductor cable is exposed to one or more two step heat treatments after a deformation or cabling step, which includes (a) heating the cable at a temperature substantially in the range of 810–860° C. for a period of time substantially in the range of 0.1 to 300 hours at a $P_{O2}$ substantially in the range of 0.001–1.0 atm; and (b) cooling the cable to a temperature substantially in the range of 780–845° C. for a period of time substantially in the range of 1 to 300 hours at a $P_{O2}$ substantially in the range of 0.001–1.0 atm, with no deformation or cabling occurring after the final heat treatment.

In yet another aspect of the present invention, an oxide superconductor cable containing a desired oxide superconductor phase is exposed to a final heat treatment after a deformation or cabling step, which includes (a) subjecting the cable to an oxygen partial pressure sufficient to partially melt the oxide superconducting article, such that a liquid phase co-exists with the desired oxide superconductor; and (b) raising to an oxygen partial pressure sufficient to transform the liquid phase into the desired oxide superconductor.

Thus, a highly textured cabled conductor with improved AC loss characteristics containing a superconducting oxide with irreversible melting characteristics such as BSCCO 2223, and a process for manufacturing it is provided. A transposed cabled conductor containing superconducting oxide strands in highly aspected forms and a method for manufacturing it is also provided. The novel cabled conductor manufacturing process of the invention allows a superconducting oxide composite to be used with conventional high-speed cabling equipment. The method improves superconducting performance of oxide superconductor cables by healing cracks and defects formed during cabling of oxide superconductors strands. Cables having a critical current density of about 10,000 A/cm$^2$ at 77K, self field, have been prepared in accordance with the method of the invention.

A feature of the invention is a two-step heat treatment which introduces a small amount of a liquid phase co-existing with the oxide superconductor phase, and then transforms the liquid back into the oxide superconductor phase.

An advantage of the invention is the production of highly defect-free oxide superconductor cables which exhibit superior critical current densities.

BRIEF DESCRIPTION OF THE DRAWING

The invention is described with reference to the Drawing, which is provided for the purpose of illustration only and is in no way limiting of the invention, and in which:

FIG. 1 is a processing profile of the final heat treatment of the invention;

FIG. 2 is a processing profile used to obtain a textured oxide superconductor cable according to the method of the invention;

DESCRIPTION OF THE PREFERRED EMBODIMENT

Figure 3A:
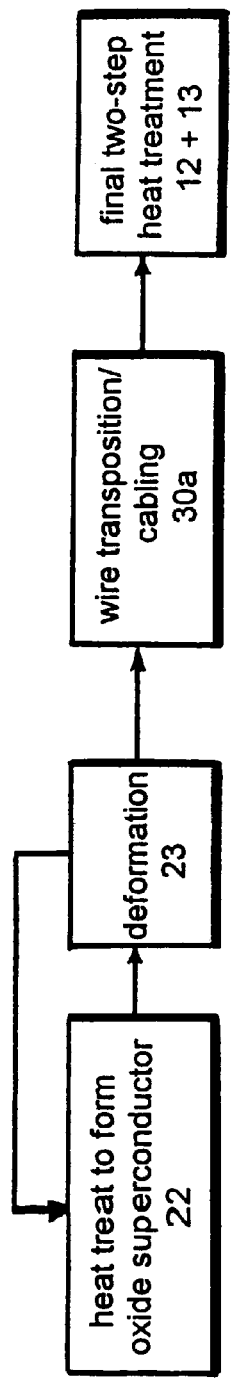
FIG. 3 is a schematic diagram illustrating processes of the present invention.
Figure 3B:
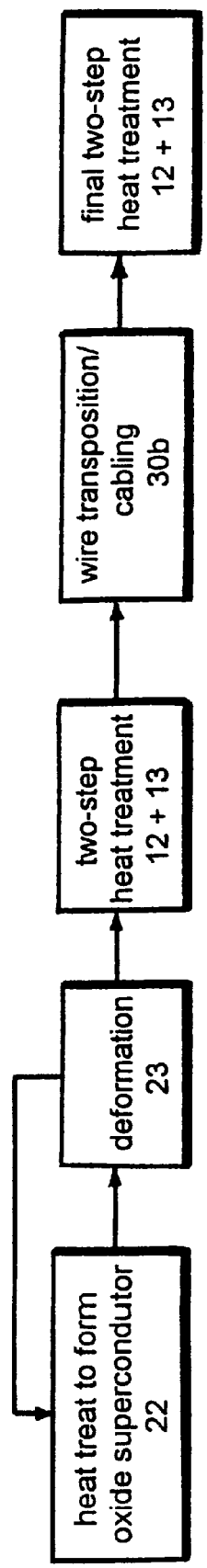

The present invention is directed to a highly textured oxide superconductor cable having improved AC loss characteristics, as compared to a monolith conductor. The oxide superconductor used in the cable possesses irreversible melting characteristics which lends itself to the improved texturing and critical current density observed in the invention.

The present invention also is a method for improving the critical current density of oxide superconductor cables by healing defects, such as micro- and macrocracks and bending strain defects, incurred upon DIT deformation, cabling, or both, of the individual oxide superconductor composite strands. The present invention calls for a one or more two-step treatments after deformation, cabling, or both of the oxide superconductor cable, in which (a) a liquid phase is formed such that the liquid phase co-exists with the desired oxide superconductor; and (b) the liquid phase is then transformed into the desired oxide superconductor without any intermediate deformation. The methods of the invention can be used to heal defects in any oxide superconductor or superconducting composite cable which result from DIT processing and/or cabling operations.

The two step heat treatment operates in the following manner to heal defects. The liquid phase is formed upon partial melting of the oxide superconductor cable. During partial melting of the cable, non-superconducting materials and intermediate oxide phases may be present with the desired oxide superconductor phase. During the partial melting step of the invention the desired oxide superconductor, the non-superconducting materials, oxide superconducting precursors, the desired oxide superconductor or a mixture of these components may melt to form the liquid phase. The above process, which required that liquid co-exist with the desired oxide superconductor phase, is distinguished from those which involve the peritecitic decomposition of the oxide superconductor, such as described by Kase et al., in which the desired oxide superconductor decomposes during the melting process.

The type of cabling styles which are contemplated for use in this process include, but are in no way limited to, Roebel cabling, Rutherford cabling, braiding and other forms of Litz cabling. Rigid or planetary forms of any of these may be used. Litz cable has complete transposition of strands. Roebel, Rutherford and braids are special types of Litz cables. Some cable types, such as a six around one configuration do not have complete transposition, but may also be satisfactory. Suitable strand texturing and cabling techniques are set forth in U.S. application Ser. No. 08/554,814 entitled "Cabled Conductors Containing Anisotropic Superconducting Compounds and Method for Making Them", filed on even date herewith, in U.S. application Ser. No. 08/554,737, now abandoned entitled "Low Resistance Cabled Conductors Comprising Superconducting Ceramics" filed on even date herewith, and in U.S. application Ser. No. 08/554,693, now U.S. Pat. No. 5,885,938 entitled "Low Aspect Ratio Superconductor Wire" filed on even date herewith.

The method of the invention is particularly useful for oxide superconductor articles which possess defects perpendicular to the direction of current flow. In such instance, the defects disrupt the percolative pathway for current flow. It is expected therefore, that healing of such defects will have a marked effect on current carrying ability.

FIG. 1 shows a processing profile of the two-step heat treatment of the invention. A dashed line 10 indicates a processing point at which a liquid phase is formed for a given set of processing conditions, e.g., T, $P_{O2}$, $P_{total}$ and/or oxide composition.

In the oxide superconductors and superconducting composites disclosed herein, processing conditions for obtaining the requisite liquid and solid oxide phases are well established and the relationship between temperature, oxygen partial pressure and total pressure is reasonably well understood. For further information on the phase diagrams for YBCO, BSCCO and the thallium-based systems, the interested reader is directed to "Phase Diagrams for High T, Superconductors", John D. Whitler and Robert S. Roth, Ed.; American Ceramic Society, Westerville, Ohio.

Presence of a liquid phase can also be determined experimentally by use of such conventional techniques as differential thermal analysis (DTA). In DTA, exothermic and endothermic reactions as a function of temperature can be identified and attributed to various thermodynamic and chemical processes. It is possible to identify endothermic processes corresponding to partial melting, i.e., liquid phase formation.

It is desired that only a small amount of liquid be formed during partial melting. The reason for this is that, in preferred embodiments of the invention, at the time that the two-step heat treatment is applied, the article may already possess substantial texture. Complete or significant liquid formation at this point would result in loss of texture. Volume percent of the liquid phase is typically in the range of 0.1 to 30.

The oxide superconductor strands are cabled at a point 11a before a two-step heat treatment, at which time bending strain may introduce defects, such as microcracks, into the cabled article. The oxide superconductor strands are typically deformed at a point 11 before a two-step heat treatment, at which time defects such as microcracks may be introduced into the article. Suitable deformation can include swaging, extruding, drawing, pressing, hot and cold isostatic pressing, rolling, and forging of wires, tapes and a variety of shaped articles. However, in some embodiments of the invention, the strands may be textured before or after cabling by an alternative texturing method which does not independently introduce defects into the cabled article. As will be seen in a discussion below, cabling and deformation or other texturing steps may be performed at different stages in the process with respect to each other and with respect to one or more of the two-step heat treatments, and such variations are within the scope of the invention. Conventional cabling machines used to cable conventional current carrying wires may be used. By way of example only, these may include Rutherford cabling, braiding, Roebel cabling, and other forms of Litz cabling machines. A Litz cable is any cable with transposed, insulated strands; however, an uninsulated strand may also be cabled. These will not retain mechanical or electrical isolation but may be useful for DC applications.

Referring again to FIG. 1, the processing conditions are adjusted to bring the cable to point 12 where the article is partially melted and a liquid phase co-exists with the desired oxide superconductor phase. The cable is held at point 12 for a period of time during which the defect surfaces contained within the oxide superconductor are wet by the newly-formed liquid. In the case of BSCCO-2223, a temperature of 820–835° C. at 0.075 atm $O_2$ for 0.1–300 hours and preferably 12–300, and more preferably 50–200 hours is sufficient.

The processing parameters are then adjusted to bring the oxide superconductor cable to point 13 where the liquid phase is consumed and the desired oxide superconductor phase is formed from the melt. In the case of BSCCO-2223, a temperature of 820–790° C. at 0.075 atm $O_2$ for 1 to 300 hours is sufficient. The processing temperature will vary dependent upon the oxygen pressure. Additionally, variations in the chemical composition of the article will also affect selection of temperature and pressure. In particular, it has been noted that addition of silver to the oxide composition lowers the temperature range for partial melting, particularly at higher $P_{O2}$ (0.1–1.0 atm).

Hence, the two-step heat treatment heals cracks and other defects. The partial melting during the final part of the process can perform two tasks. Firstly, the final conversion of the oxide phases to the desired oxide superconductor phase is kinetically enhanced by the presence of the liquid phase, in part, due to the enhanced diffusivity of the oxide superconductor constituents. The conversion rate of BSCCO 2212 to BSCCO 2223, for example, is greatly accelerated, allowing the formation of a microscopically crack-free, interconnected BSCCO 2223 phase. Secondly, the cracks formed during the prior deformation or cabling steps are healed by rapid growth of the oxide superconductor grains at the crack site.

Various processing parameters can be controlled to obtain the necessary partial melt and oxide reforming steps. For example, $P_{O2}$ can be held constant and temperature can be raised to promote melting and formation of the liquid phase and lowered to regenerate the desired oxide superconductor. Alternatively, temperature can be held constant, and $P_{O2}$ can be lowered to promote the partial melting of the oxide superconductor article and raised to reform the oxide superconductor. For constant $P_{o2}$ conditions, temperature should increase and for constant temperature conditions, $P_{O2}$ should decrease sequentially through the two-step process. Thus, conditions are selected which give a two-step process, in which the thermodynamic state is changed from the first to the second condition. Ideally the thermodynamic state is altered so as to destabilize the liquid in the second step with respect to the desired oxide phase superconductor. This is in contrast to systems in which conditions are varied between a first and second step, but in which such adjustments to not change the thermodynamic state of the system with respect to the stability of the liquid phase.

The processing conditions can be changed rapidly from point 12 to point 13 of the process (fast ramp rate). Alternatively, the oxide superconductor can be subjected to gradually changing conditions (of temperature or pressure) between point 12 and point 13 of the process designated by the curve 14 in FIG. 1 (slow ramp rate). In another alternative embodiment, there need be no "hold" at 13. The processing conditions can be slowly ramped from the processing conditions defined at point 12 to the processing conditions defined for point 13. This process is illustrated by curve 15 in FIG. 1.

The method of forming textured oxide superconducting cables is described with reference to oxides of the BSCCO family; however, this is in no way meant to limit the scope of the invention. The present invention can be practiced with any oxide superconductor system in which a liquid phase co-exists with an oxide superconductor phase such that an irreversible melt occurs and which is amenable to deformation-induced texture processing.

Methods of obtaining highly textured oxide superconducting strands using the two-step heat treatment of the invention is described in detail in U.S. Ser. No. 08/041,822 which is now issued as U.S. Pat. No. 5,635,456 and is incorporated herein by reference. FIG. 2 shows a processing profile for a method of the invention used to obtain highly textured oxide superconductor cable using this two-step heat treatment. The cabling operation may be performed at various stages in the process, as is discussed hereinbelow.

In a preferred embodiment, an oxide superconductor precursor is subjected to one or more first anneal/deformation iterations, denoted by step 20 and step 21, respectively, of FIG. 2. The oxide superconductor precursor can be any combination of materials which will yield the desired oxide superconductor upon reaction. In particular, it may be a metallic alloy containing the metallic constituents of the desired oxide superconductor and optionally containing silver. Alternatively, the constituent simple metal oxides, mixed metal oxides, metal salts and even intermediate oxide superconductors of the desired oxide superconductor may be used as a precursor. The precursor may optionally be mixed with a matrix metal, such as silver, and/or may be sheathed in a matrix material in a powder-in-tube configuration.

The anneal 20 of the anneal/deformation iteration serves two purposes in the process. Firstly, the anneal is sufficient to form an oxide superconductor and results typically in a mixture of superconducting and secondary phases. "Secondary phases" include sub-oxide or non-superconducting oxide species which require further processing to form an oxide superconductor phase. BSCCO-2212 is often the intermediate oxide superconductor because it is readily textured during mechanical deformation. BSCCO-2223 is the typical desired oxide superconducting phase because of its high critical temperature. Secondly, the anneal promotes reaction-induced texture.

The deformation 21 of the article promotes deformation-induced texture. One or more iterations can be performed. FIG. 2 shows two first anneal/deformation iterations, by way of example only. If more than one iteration is performed, both conversion to the superconducting phase and development of texture can be done in incremental stages.

If the desired oxide superconductor is not formed in the first anneal/deformation iterations, the second step of the process may consist of one or more second anneal/deformation iterations to form the desired oxide superconductor and to further texture the oxide superconductor phase. The article is annealed in a step indicated by 22 whereby the desired oxide superconductor is formed and reaction-induced texture can occur. Secondary phases react with BSCCO-2212 to form the desired oxide superconductor, BSCCO-2223. The article is deformed in a subsequent step indicated by 23, whereby deformation-induced texture can occur. One or more second anneal/deformation iterations can be performed. FIG. 2 shows two iterations, by way of example only. If more than one iteration is used, only a portion of the intermediate oxide superconductor, need be converted into the desired oxide superconductor with each iteration. Conditions known to form intermediate and desired oxide superconductors are well known in the art. Suitable conditions are described in Sandhage, et al. JOM, 21 (Mar. 1991), hereby incorporated by reference.

Practically, the incremental improvement in alignment for both anneal/deformation cycles will decrease markedly after several iterations, however, there is no theoretical limit to the number of iterations that can be used. The strain introduced in the deformation step can range up to 99%. The strains applied in each deformation/anneal iteration may be constant or they may be changed for each subsequent iteration. It is particularly desirable in some embodiments, to use decreasing strains with each subsequent iteration.

It is also possible to adjust the processing conditions to promote partial melting during the anneal 20 or 22 of the anneal/deformation iterations, indicated by step 24, to assist in grain growth and enhance reaction kinetics (reaction-induced texture). An anneal in the range of 820–835° C. in 0.075 atm $O_2$ and 1 atm total pressure for 0.1 to 100 hours is typical for partial melting to occur.

The above description is directed to the formation of a textured oxide superconductor within the individual strands. A cabling step 30 may be carried out at a number of stages during the processing of the oxide superconductor cable, designated 30a, 30b, 30c, 30d in FIGS. 2 and 3. The choice of when in the process to cable the oxide strands depends upon the nature of the oxide superconductor and the type of cabling operation to be performed. Generally, cabling early in the manufacturing process is preferred to get uniform good direction texture independent of cabling style; also earlier cabling may be preferred to minimize strain. It also may be desirable to coat each individual oxide superconductor strand with an insulating layer, such as for example, MgO prior to cabling. Alternatively, the final cabled article may be coated with an insulating layer. Coordination of oxide superconductor formation and cabling operation is shown in FIG. 3.

In one embodiment, the oxide superconductor strand is processed by one or more suitable texturing methods in order to convert the precursor into the desired oxide superconductor and to substantially completely texture the oxide superconductor. In the most preferred embodiment illustrated in FIG. 3(*a*), the texturing is accomplished by successive anneal/deformation iterations. Thereafter, the textured oxide strands are cabled in a step 30a (see, FIGS. 2 and 3). The cable is then subjected to the final two-step heat treatment of the invention in order to heal the defects introduced in the cabling step, and if deformation was performed, in the deformation steps.

In another embodiment illustrated in FIG. 3(*b*), the oxide superconductor strand is processed by successive anneal/deformation iterations in order to convert the precursor into the desired oxide superconductor and to substantially completely texture the oxide superconductor. A two-step heat treatment of the invention is performed in order to heal defects (microcracks and the like) introduced in the deformation processing steps. Thereafter, the individual oxide superconductor strands are cabled in a step 30b (see, FIGS. 2 and 3). A final two-step heat treatment of the invention is performed in order to heal defects introduced in the cabling process. It is recognized that other wire processing operations may benefit from the two-step heat treatment of the invention. For example, coil formation and spooling at small radii of curvature may introduce bending strains similar to those introduced in cabling operations. It is expected that performing a two-step heat treatment of the invention will benefit current carrying properties after these operations as well. The processes illustrated in FIGS. 3(*a*) and 3(*b*) benefit from the full texturing of the individual oxide strands before the cabling process. While optimal texturing in the individual strands is beneficial to current carrying capacity, the oriented strands may have a lower tolerance to bending strains.

Another embodiment is illustrated in FIG. 3(*c*). The oxide superconductor strand is processed as above by successive texturing operations, preferably including successive anneal/deformation iterations, in order to convert the precursor into the desired oxide superconductor and to texture the oxide superconductor. At some point during this iterative process, the not-yet-fully-reacted- and-textured oxide superconductor strands are cabled in a step 30c (see, FIGS. 2 and 3). Further texturing is performed on the cable to complete the reaction to the oxide superconductor and to fully texture the oxide superconductor. Thereafter, a final two-step heat treatment is performed in order to heal defects introduced by both the deformation and cabling processes. A typical processing sequence may include a first anneal and deformation (20, 21), a cabling operation (30c), and a second anneal and deformation (22, 23), followed by the final two-step heat treatment of the invention.

Figure 3C:
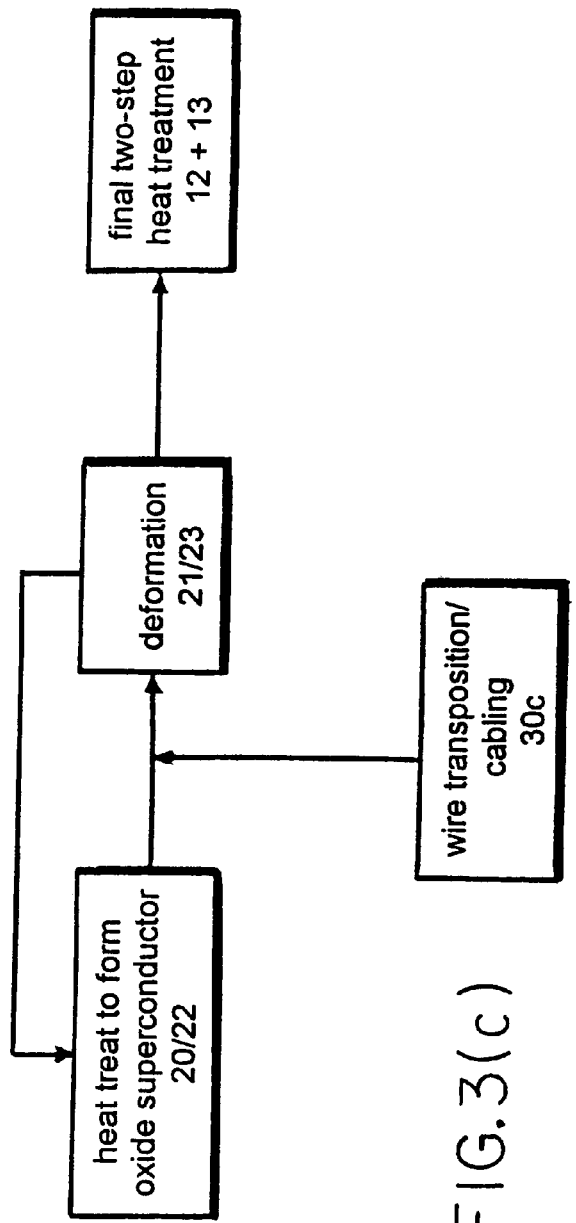
Figure 3D:
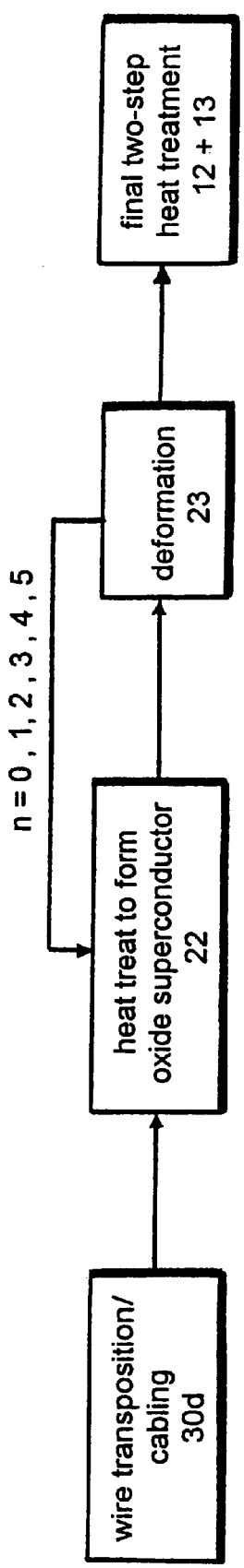

In yet another embodiment of the invention, the cabling operation is performed on a precursor strand before a significant texture is developed in strands and while density is low. Thereafter, a two-step heat treatment is performed in order to heal defects introduced by the cabling processes, and texturing is completed. FIG. 3(d) illustrates one such approach, in which the cabling operation 30d is performed on a precursor strand prior to a series of successive texture-inducing deformation and reaction iterations (see, FIGS. 2 and 3) where the number of iterations, n, can vary from zero to five, and a final two-step heat treatment heals defects induced by both the cabling and deformation steps. However, a plurality of two step heat treatments might equally be performed. Because the cabling operation illustrated in FIGS. 3(c) and 3(d) is performed on the oxide superconductor strands that are not fully textured, that is, the aspect ratio of the oxide grains is less than optimal and the density is relatively low, it may be expected that the deleterious effect of cabling on the critical current density is reduced; however, subsequent texturing operations may be less efficient due to the varied strand orientations after cabling.

The oxide superconductors which make up the oxide superconductor cables of the present invention are brittle and typically would not survive a mechanical deformation process, such as rolling or pressing. For this reason, the oxide superconductors of the present invention are typically processed as a composite material including a malleable matrix material. In particular, silver is preferred as the matrix material because of its cost, nobility and malleability; however, other noble metals may be used. A metal is considered noble when it is inert to oxidation and chemical reaction under the processing conditions of the oxide superconductor. The oxide superconductor strands may be processed in any shape, however, the form of wires, tapes, rings or coils are particularly preferred. The oxide superconductor strand may be encased in a silver sheath, in a version of the powder-in-tube technology. The oxide superconductor strand can take the form of multiple filaments embedded within a silver matrix. For further information on superconducting tapes and wires; see, Sandhage et al.

EXAMPLE 1

The following example describes the manufacture of an oxide superconductor strand for use in the cabling operations of the present invention which is described in U.S. Ser. No. 08/041,822 and is hereby incorporated by reference, and compares the transport critical current characteristics of a samples treated with the two-step heat treatment of the present invention to those of conventionally processed samples.

Precursor powders were prepared from the solid state reaction of freeze-dried precursor of the appropriate metal nitrates having the nominal composition of 1.7:0.3:1.9:2.0:3.1 (Bi:Pb:Sr:Ca:Cu). $Bi_2O_3$, $CaCO_3$, $SrCO_3$, $Pb_3O_4$ and $CuO$ powders could be equally used. After thoroughly mixing the powders in the appropriate ratio, a multistep treatment (typically, 3–4 steps) of calcination (800° C.±10° C., for a total of 15 h) and intermediate grinding was performed in order to remove residual carbon, homogenize the material and to generate the low $T_c$ BSCCO-2212 oxide superconductor phase. The powders were packed into silver sheaths having an inner diameter of 0.625" (1.5875 cm) and a length of 5.5" (13.97 cm) and a wall thickness of 0.150" (0.38 cm) to form a billet.

The billets were extruded to a diameter of ¼" (0.63 cm). The billet diameter was narrowed with multiple die passes, with a final pass drawn through a 0.070" (0.178 cm) hexagonally shaped die into silver/oxide superconductor hexagonal wires. Nineteen of the wires were bundled together and drawn through a 0.070" (0.178 cm) round die to form a multifilamentary round wire. The round wire was rolled to form a 0.009"×0.100" (0.023 cm×0.24 cm) multifilamentary strand.

A length of the multifilamentary strand was then subjected to a heat treatment according to the invention. The composite strand was heated in a furnace in a first anneal at 820° C. in 0.075 atm $O_2$ for 48 h. The first anneal formed significant amounts of the desired oxide superconductor phase, BSCCO-2223. The composite strand was then rolled to reduce thickness by 11% (0.009" to 0.008"). Lastly, the rolled composite strand was subjected to a final two-step heat treatment, namely, heating from room temperature at a rate of 1° C./min to 820° C. in 0.075 atm $O_2$ and holding for 54 h, cooling to 810° C. in 0.075 atm $O_2$ and holding for 30 h. The sample was furnace cooled to room temperature in 1 atm $P_{O2}$.

A length of multifilamentary strand was also subjected to a conventional heat treatment. The composite strand was heated in a furnace in a first anneal at 820° C. in 0.075 atm $O_2$ for 48 h. The first anneal caused significant amounts of the desired oxide superconductor phase, BSCCO-2223 to form. The multifilamentary strand was then rolled to reduce thickness by 11% (0.009" to 0.008"). The control samples were then subjected to a second anneal at 810° C. in 0.075 atm $O_2$ for 84 h. This was a single step heat treatment in which no melting of the sample occurs.

The microstructure of the samples were evaluated under an optical microscope. The samples prepared according to the method of the invention had a higher density and far less cracks than the control samples.

The critical currents of the samples using a criterion of 1 $\mu$V/cm, 77 K and zero applied field were determined. A single critical current was determined end-to-end over a long length of strand (7–10 m). Critical current for a number of 10 cm lengths of composite strands were determined and an average value was determined. The results are reported in Table 1 and show that samples processed according to the method of the invention exhibited a factor of at least two improvement in critical transport properties.

TABLE 1

A comparative study of the method of the invention with a conventional process.

| sample no. | length (m) | $I_c$ (A) | % σ | $J_c$ (A/cm$^2$) |
|---|---|---|---|---|
| Example 1-1 | 10 | 6.05 | — | 7563 |
| Example 1-2 | 0.1 | 9.52 | 13 | 11,900 |
| Control 1-1 | 7 | 2.23 | — | 2788 |
| Control 1-2 | 0.1 | 4.08 | 16 | 5100 |

Further demonstrations of the superior performance of oxide superconductor strands prepared using a final two-step heat treatment of the invention are found in U.S. Ser. No. 08041,822, incorporated herein by reference.

EXAMPLE 2

This example demonstrates the manufacture of a multi-strand power cable using oxide superconductor strands.

Precursor powders were prepared from the solid state reaction of freeze-dried precursor of the appropriate metal nitrates having the nominal composition of 1.7:0.3:1.9:2.0:3.1 (Bi:Pb:Sr:Ca:Cu). $Bi_2O_3$, $CaCO_3$, $SrCO_3$, $Pb_3O_4$ and CuO powders could be equally used. After thoroughly mixing the powders in the appropriate ratio, a multistep treatment (typically, 3–4 steps) of calcination (800° C.±10° C., for a total of 15 h) and intermediate grinding was performed in order to remove residual carbon, homogenize the material and to generate the low $T_c$ BSCCO-2212 oxide superconductor phase. The formulated powder was packed into the open end of a silver billet under hydraulic pressure. The silver billet was open at one end and closed at the other and had a length of 8.00"±0.15" (20.32 cm), an outer diameter of 1.25"±0.005" (3.18 cm) and a inner diameter of 0.85"±0.005" (2.16 cm).

The billets were extruded to a diameter of 0.5" (1.27 cm), then were placed into a furnace at 450° C. for one hour to anneal. The billets were drawn through progressively smaller round dies until they reach a diameter of 0.0785" (0.199 cm). Each pass through the die reduced the diameter by 5% to 11%. The next step was to draw the wires through hexagonal shaped dies to their final hexagonal wire dimension of 0.070" (0.178 cm).

The hexagonal shaped wires were cleaned with suitable cleaning agents; then cut into 85 equal lengths; and then grouped together to form a hexagonal shaped bundle. The bundle was inserted into a pure silver tube having an outer diameter of 0.840"±05.015" (2.133 cm) and an inner diameter of 0.760"±0.0015" (1.93 cm). After bundling, the multifilament bundle was placed in a furnace at 450° C. for four hours to anneal. The annealed multifilamentary bundle was allowed to cool before it is drawn through a round die of progressively smaller dimension until it reached the final wire diameter of 0.072" (0.183 cm). The wire was place into a furnace at 600° C. for 2 hours to thermally bond the assembly.

The round strand was then rolled in three reduction passes to a final dimension of 0.010 inch (0.025 cm)×0.0100 inch (0.254 cm) with intermediate heat treatments in which the strand is ramped to 815° C. at 1° C./min, held at 815° C. for 16 hours and cooled to room temperature, all at 7.5% oxygen. After a final anneal at 450° C. for one our, twelve lengths of the strand were cut to about 8 inches for cabling.

Figure 4:
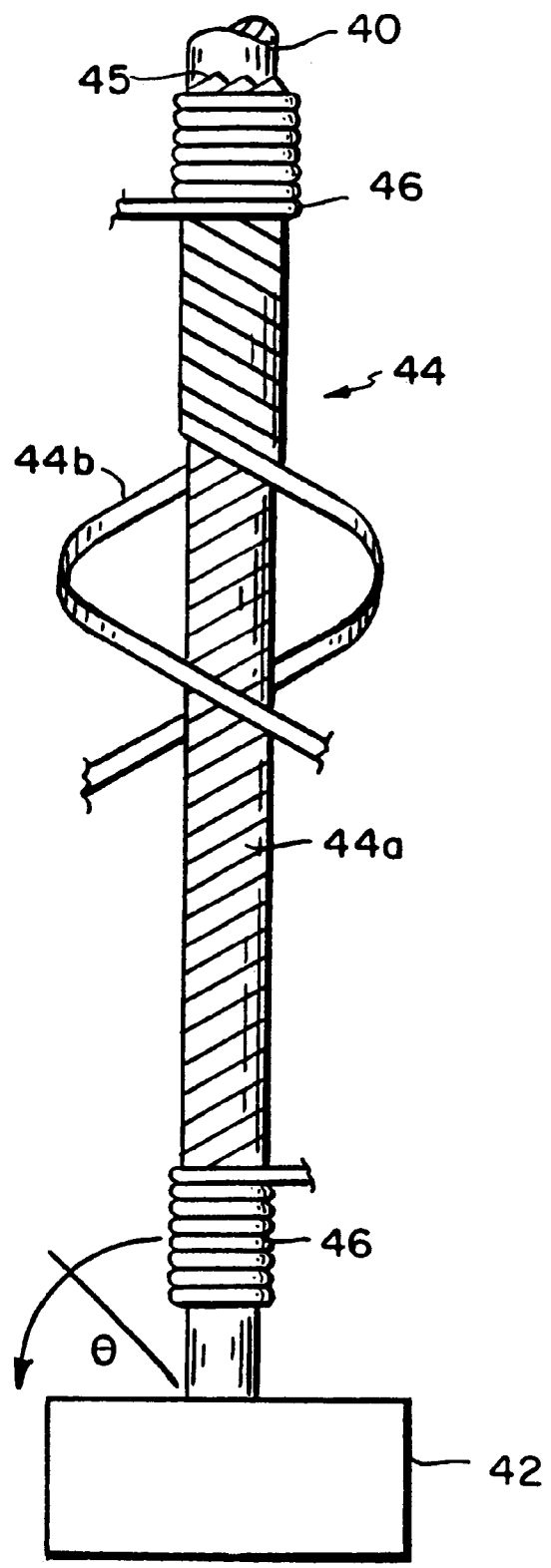
FIG. 4 is a schematic illustration of a cabling operation according to the invention.

FIG. 4 is a side view of a cabling operation used to form the cable of the present invention. It is understood that the hand assembly described in this example could be readily substituted by commercially available processes, such are currently used in the cable industry.

Using a protractor, a silver tube 40 is mounted in a vise 42. The tube 40 may be mounted at an angle θ in the range of 0° to 40°, and preferably at a an angle of 25°±5°. With a sharp instrument, several guide lines were lightly scored into the silver tube at the angle θ set by the tube 40. Twelve lengths of oxide superconducting strands 44 were cut to a length of about two inches longer than the tube 40 length. Six of the oxide strands 44a are secured to an uppermost edge 45 of the tube 40 and were positioned so as to be aligned with the scored guidelines and/or to hang substantially perpendicular to the ground. Once aligned, the oxide strands 44a are spiral wrapped around the tube 40. The strands may be wrapped by rotation of the strands around a stationary tube or, in a preferred embodiment, by rotation of the tube, while maintaining the strands at the selected angle θ with respect to the tube. Once spiral wrapped, the strands are secured at the lowermost edge of the tube. The strands may be wrapped one at a time or simultaneously.

The above process is repeated at the complementary angle (−θ), so that the remaining six oxide superconducting strands 44b are spiral wrapped in the opposite direction, such that a second layer of spiral wrapped strands is formed. The strands 44a, 44b are secured top and bottom with a silver wire 46.

Figure 5:
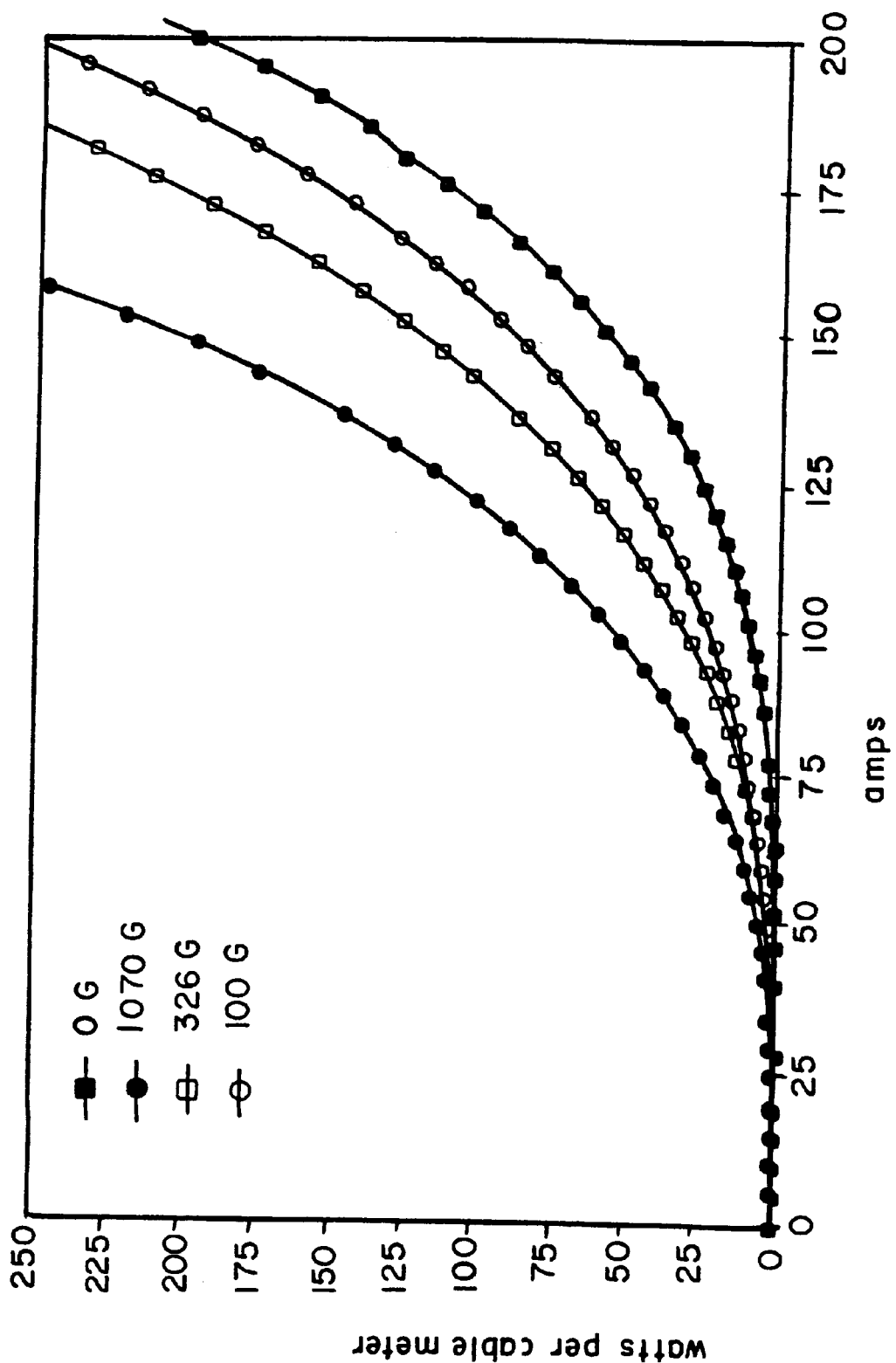
FIG. 5 is a power vs. current for a cable of the present invention determined at a variety of magnetic field strengths.
Figure 6:
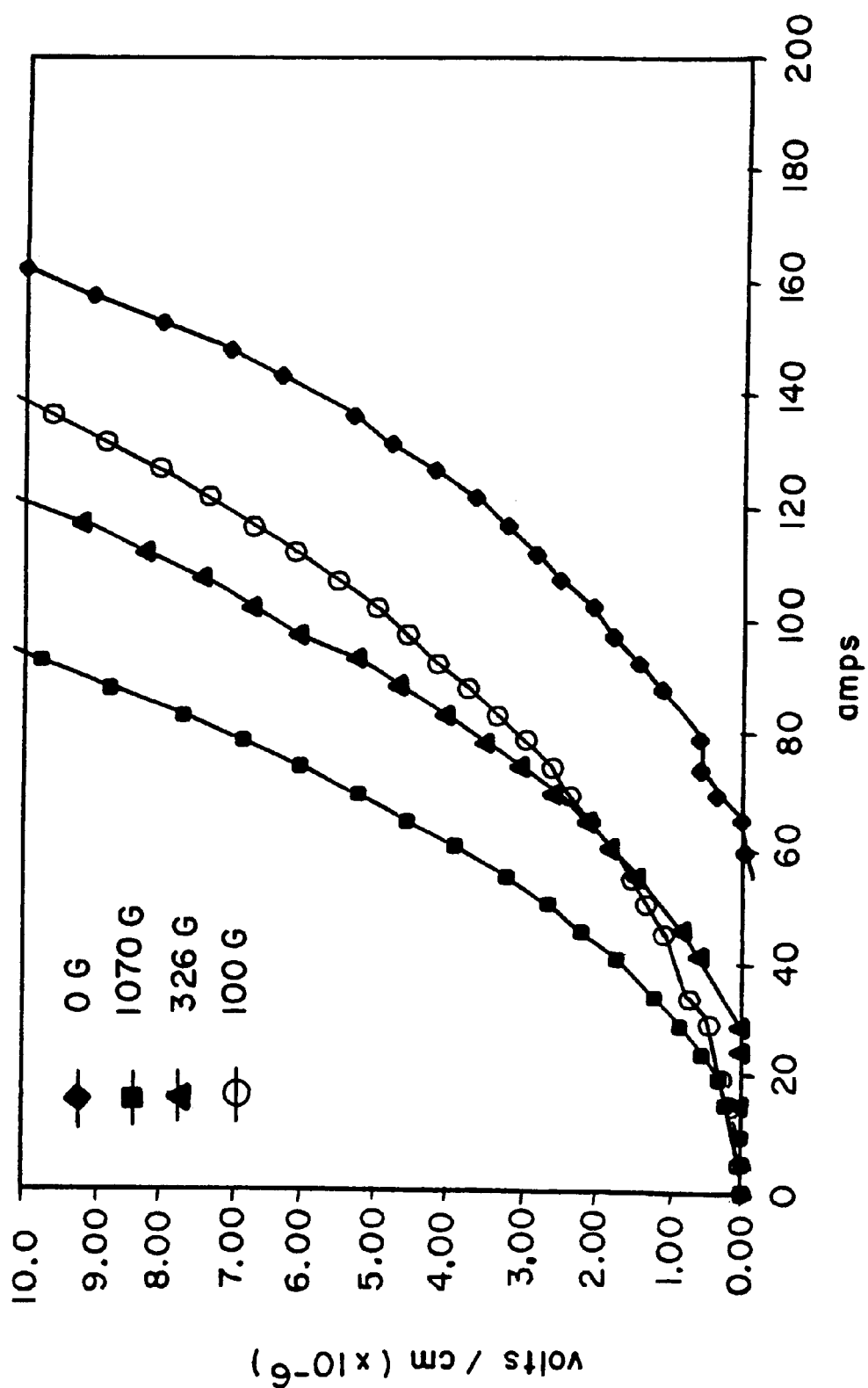
FIG. 6 is a V-I plot (electric field vs. current) for a cable of the present invention determined at a variety of magnetic field strengths.

When the second layer is completed, the assembly is removed from the vise and lightly compressed in a hydraulic press at 10 Kpsig. The flattened cable assembly is subjected to a two-step heat treatment involving a 40 hour bake at 830° C. followed by a 40 hour bake at 811° C. followed by a 30 hour bake at 787° C. in 7.5% oxygen at one atmosphere total pressure. FIG. 5 shows the power consumption of the cabled conductor in watts/m of the cable per amp of applied current in magnetic fields of 0, 100, 326 and 1070 Gauss. FIG. 6 shows the VI characteristics of that same cabled conductor in the same applied magnetic fields and demonstrates that the cable has substantially linear VI characteristics.

Comparison Example 2

Figure 7:
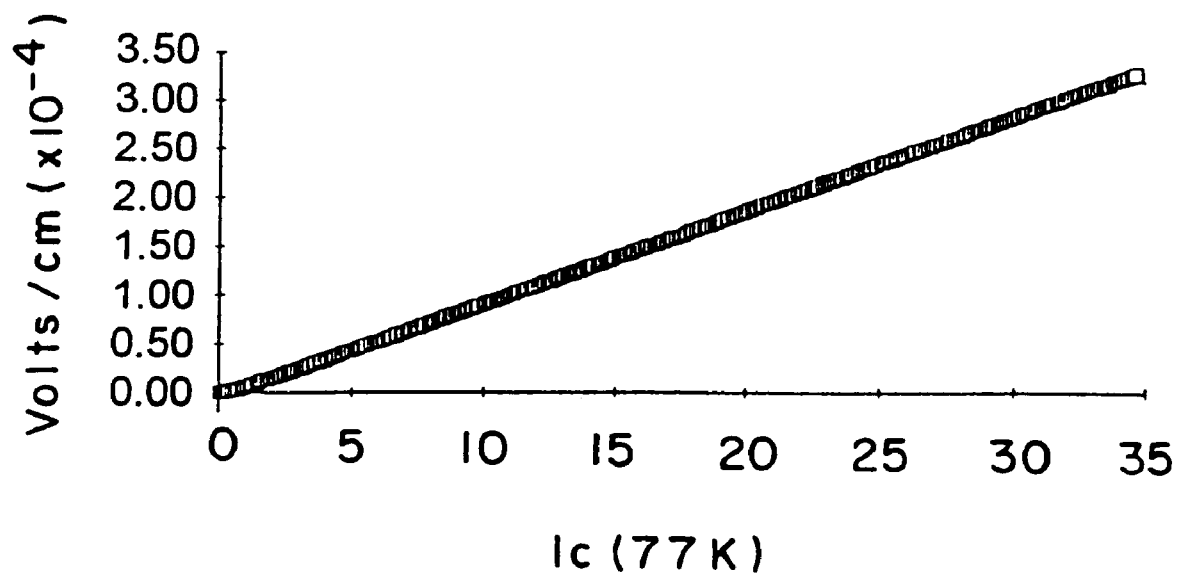
FIG. 7 is a V-I plot (electric field vs. current) at 77K, self field, for a cable prepared without the method of the invention.

As a comparison, a cable was processed in substantially the same manner as described in Example 2, but without the final two-step heat treatment of the invention. the cable was evaluated for current carrying ability. The plot of electric field vs current plot at 77K shown in FIG. 7 demonstrates the VI characteristics of the cable. It can be seen that the cable was resistive and had no significant current carrying capability.

EXAMPLE 3

Square cross-sectioned (0.070"×0.070") multifilamentary (1254 filaments) precursor alloy/silver composite wires having the appropriate stoichiometry for BSCCO-2223 were fabricated, and oxidized at 405° C. for 600 hours in 100 atm oxygen. After oxidation, they were reacted in 7.5% oxygen gas at one atmosphere total pressure for 6 hours to form BSCCO 2212+BSCCO 0011 reactant. They were then square bar rolled forward and in the reverse direction in 10% and 20% area reduction increments with anneals every third pass consisting of a 10 minute bake at 200° C. in air until they were 0.033"×0.033" in cross-section (78% area reduction). They were then sheet rolled forward and in reverse at ambient temperature with a 2-high rolling mill with 4" diameter rolls until their dimensions were 0.023"× 0.045" in cross-section (4 passes). A series of experiments were then completed to determine a suitable final heat treatment sequence for forming sintered and textured BSCCO 2223 from the textured BSCCO 2212+BSCCO 0011 as well as forming the wires into a cable via a planetary winding scheme such that they are separated by a fairly resistive layer in the cable.

In the best method, the wires were baked at 829° C. for about 10 hours in 7.5% oxygen at a total pressure of one atmosphere followed by sheet rolling to a 15% thickness reduction in one pass, and a second bake at 829° C. for about 10 hours in 7.5% oxygen gas at one atmosphere total pressure. The wires thus processed were then manually cabled to form 5-strand cable samples such that the same surface of each wire was parallel to the external cable surface regardless of position in the cable. The cable pitch was about 1.3". The wires were cabled by bending them sequentially onto a 0.1"×0.01" copper tape former without rotating the wire about its own or the cable axis, thereby preserving alignment of each wire surface with a corresponding surface of the cable. After cabling, the copper strip was removed.

Some wires were coated with MgO prior to and after cabling by dipping into a fine MgO powder/alcohol suspension and drying with forced hot air. The cables were then 2-high rolled with 4" diameter rolls to a wire thickness reduction of 10%, thereby consolidating the cable into a well defined, structurally integral form. The cabled wires were then subjected to the two step heat treatment of the invention to sinter the BSCCO 2223. This heat treatment consisted of a 30 hour bake at 829° C. followed by a 60 hour bake at 811° C. followed by a 20 hour bake at 787° C. in 7.5% oxygen at one atmosphere total pressure.

The transport properties of the cables and co-processed un-cabled wires were measured at 77K in self field. The results are presented in Table 2.

TABLE 2

Results of Electrical Measurements

| Sample History | Cable Type | Cable Ic at 77K (A) |
|---|---|---|
| 1) Cable, no MgO slurry | 5-wire, 10% HTS oxide fill factor | 6.0 |
| 2) Cable dipped in MgO slurry before the final heat treatment | 5-wire, 19% HTS oxide fill factor | 10.1 |
| 3) Cable dipped in MgO slurry after cabling | 5-wire, 19% HTS oxide fill factor | 10.8 |

EXAMPLE 4

Oxide superconducting strands were prepared according to Example 2. The oxide superconductor multistrand cable was assembled as follows.

Construction of the cable assembly is similar to that described in Example 2, except that two pieces of oxide superconductor wire having a diameter of 0.015" and a composition of substantially BSCCO 2212 are used in place of the silver core tube. The two wires are secured together to form a core of 0.017" thick and 0.300" wide. Six strands of oxide superconductor strands prepared according to Example 2 above are spiral wrapped in one direction at an angle of 25° and six strands are wrapped in the other direction, also at an angle of 25°.

When the second layer is completed, the assembly is removed from the vise and lightly compressed in a hydraulic press at 10 Kpsig. The flattened cable assembly is subjected to a final two-step heat treatment of a 40 hour bake at 830° C. followed by a 40 hour bake at 811° C. followed by a 30 hour bake at 787° C. in 7.5% oxygen at one atmosphere total pressure.

EXAMPLE 5

Oxide superconducting strands were prepared according to Example 2. The oxide superconductor multistrand cable was assembled as follows.

A 0.003" quartz sheet was laid our on a flat metal surface and saturated with polyvinyl alcohol (PVA). The PVA-saturated sheet was heated with an iron to thermoset the plastic. After heating, the quartz sheet was cut into one half inch strips. A six inch silver tube, such as that described in Example 2, was wrapped with the quartz strips. Construction of the cable assembly is similar to that described in Example 2. Six strands of oxide superconductor strands prepared according to Example 2 above are spiral wrapped in one direction at an angle of 25° and six strands are wrapped in the other direction, also at an angle of 25°.

When the second layer is completed, the assembly is removed from the vise and lightly compressed in a hydraulic press at 10 Kpsig. The flattened cable assembly is subjected to a final two-step heat treatment of to a final two-step heat treatment of a 40 hour bake at 830° C. followed by a 40 hour bake at 811° C. followed by a 30 hour bake at 787° C. in 7.5% oxygen at one atmosphere total pressure.

EXAMPLE 6

A 91 filament composite was made by the PIT process with an approximately a hexagonal array filament pattern using standard monofilament 2223 precursor in a fine Ag sheath. Precursor powders were prepared from the solid state reaction of freeze-dried precursors of the appropriate metal nitrates having the nominal composition of 1.8:0.3:1.9:2.0:3.1 (Bi:Pb:Sr:Ca:Cu)]. $Bi_2O_3$, $CaCO_3$, $SrCO_3$, $Pb_3O_4$, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase. The powders were packed into silver sheaths to form a billet. The billets were extruded to a diameter of about ½ inch (1.27 cm) and annealed at 450 C. for 1 hour. The billet diameter was narrowed with multiple die steps, with a final step drawn through a hexagonally shaped die into a silver/precursor hexagonal monofilament wires.

Eighty-nine wires 0.049×0.090", one 0.1318 round and one 0.055 round wires were assembled and inserted into a 0.840" outer diameter by 0.740" inner diameter silver tube to form a bundle. The assembly was baked for four hours at 450 degrees the bundle was allowed to cool and then drawn through to 0.072 via successive 20% and 10 % pass reductions to for a multi-filamentary round strand. At 0.072" it was annealed at 450 degrees for one hour, allowed to cool and drawn to 0.0354" It was again annealed at 450 degrees C. for one hour, allowed to cool and then drawn to 0.0245" diameter. The composite was annealed in air at 300 C. for nominally 10 minutes. The material was divided approximately equally into 8 parts and each was layer wound onto a cabling spool.

An 8 strand Rutherford cable was made from 91 filament composite strand. A rigid cabling configuration was used, where the spools' orientation are fixed relative to the rotating support that holds them. The tension on each strand was controlled by magnetic breaks and set to nominally 0.5 inch-pounds. The width and thickness of the cable were set by a non-powered turks-head to be 0.096 and 0.048 inch, respectively. The cable lay pitch was set by a capstan take-up speed relative to the rotations speed to be nominally 1.03 inch. After cabling, the material was heat treated at 760 C. for 2 hr. in 0.1 atm of oxygen. The cable was then rolled to at thickness of 0.0157 inch and heat treated for 6 hr. at 827 C. in 7.5 % oxygen in nitrogen atmosphere. The cable was finally turks head rolled to 0.0126 inch in thickness. A final heat treatment of 40 hr. at 827 C., 30 hr. at 808 C., and 30 hr. at 748 C., all in 0.075 atm of oxygen in nitrogen was employed. The Je at 77K (B=0) was 2996 $A/cm^2$ at a fill factor of nominally 25 % superconductor cross section.

As can be seen by the above examples, the method of the invention is highly versatile and can be successfully used with a variety of deformation processes, oxide superconductor compositions, silver alloy compositions and processing conditions.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for preparing a BSCCO 2223 multifilament composite, comprising:

inducing defects into a multifilament composite comprising:
   precursor oxide of a BSCCO 2223 oxide superconductor forming said composite into a shape having a bending strain of greater than the critical bending strain of the oxide superconduct or composite;
   heating the multifilamentary composite under conditions which convert the precursor oxide into BSCCO 2223 oxide superconductor; and
   heating the formed composite comprising BSCCO 2223 oxide superconductor to repair microcracks introduced in the forming step, said heating step comprising:
   (a) heating the composite to and maintaining the composite at a temperature under conditions which partially melts the oxide superconductor such that a liquid phase coexists with a solid phase of the oxide superconductor; and
   (b) cooling the partially melted composite to and maintaining the composite at a temperature under conditions which recrystallize the liquid phase into BSCCC 2223 oxide superconductor phase.

2. The method of claim 1, wherein conditions for step (a) of the heat treatment comprise:

heating to and maintaining the temperature at between 810° C. and 860° C. for at time in the range of 0.1 to 300 hours at a $P_{O2}$ substantially in the range of 0.001–1.0 atm.

3. The method of claim 2, wherein conditions for step (b) of the heat treatment comprise:

cooling to and maintaining the temperature at between 780° C. and 845° C. for a time in the range of 1 to 300 hours at a $P_{O2}$ substantially in the range of 0.001–1.0 atm.

4. The method of claim 1, wherein the critical bending strain is in the range of 0.1% to 1.0%.

5. The method of claim 1, wherein the bending strain is about 5%.

6. The method of claim 1, wherein the bending strain is at least 10%.

7. The method of claim 1, wherein the precursor to an oxide superconductor is BSCCO 2212.

8. The method of claim 1, further comprising:

subjecting the multifilamentary composite comprising the precursor oxide to a deformation and sintering step, the deformation effective to induce alignment of the c-axis of the precursor oxide and the sintering effective to form intergranular connectivity.

9. The method of claim 8, wherein the forming step is carried out after completion of all sinter/deformation steps.

10. The method of claim 8, wherein the deformation comprises rolling or pressing.

11. The method of claim 1, wherein the multifilamentary composite is substantially electrically isolated.

* * * * *

UNITED STATES PATENT AND TRADEMARK OFFICE
CERTIFICATE OF CORRECTION

PATENT NO. : 6,194,352 B1
DATED : February 27, 2001
INVENTOR(S) : Gilbert N. Riley, Jr., Jeffrey M. Seuntgens, William L. Barnes, Gregory L. Snitchler, and Alexander Otto It is certified that error appears in the above-identified patent and that said Letters Patent is hereby corrected as shown below:

Claims,
Please delete claim 1, and insert therefore:

1. A method for preparing a BSCCO 2223 multifilament composite conductor, comprising:
inducing defects into a multifilament composite comprising a precursor oxide of a BSCCO 2223 oxide superconductor by forming said composite into a shape having a bending strain of greater than the critical bending strain of the oxide super conductor composite;
    heating the multifilamentary composite under conditions which convert the precursor oxide into BSCCO 2223 oxide superconductor; and
    heating the formed composite comprising BSCCO 2223 oxide superconductor to repair microcracks introduced in the forming step, said heating step comprising:
    (a) heating the composite to and maintaining the composite at a temperature under conditions which partially melts the oxide superconductor such that a liquid phase coexists with a solid phase of the oxide superconductor; and
    (b) cooling the partially melted composite to and maintaining the composite at a temperature under conditions which recrystallize the liquid phase into BSCCO 2223 oxide superconductor phase.

Signed and Sealed this

Twentieth Day of November, 2001

Attest:

Attesting Officer

NICHOLAS P. GODICI
Acting Director of the United States Patent and Trademark Office